US012690357B1

(12) United States Patent     (10) Patent No.:   US 12,690,357 B1

Iliev et al.     (45) Date of Patent:    Jul. 21, 2026

(54) MOLDED BODY ARMOR PANELS

(71) Applicant: ShotStop Ballistics LLC, Stow, OH (US)

(72) Inventors: Vall A. Iliev, Stow, OH (US); Martin Iliev, Stow, OH (US)

(73) Assignee: TAD Acquisition Company LLC, Akron, OH (US)

( * ) Notice: Subject to any disclaimer, the term of this patent is extended or adjusted under 35 U.S.C. 154(b) by 1101 days.

(21) Appl. No.: 17/730,639

(22) Filed: Apr. 27, 2022

Related U.S. Application Data

(60) Continuation-in-part of application No. 17/385,429, filed on Jul. 26, 2021, now Pat. No. 11,825,723, which is a continuation-in-part of application No. 17/379,675, filed on Jul. 19, 2021, now Pat. No. 11,904,648, which is a continuation-in-part of application No. 16/029,111, filed on Jul. 6, 2018, now abandoned, and a continuation-in-part of application No. 15/942,455, filed on Mar. 31, 2018, now abandoned, application No. 17/730,639, filed on Apr. 27, 2022 is a continuation-in-part of application No. 15/335,252, filed on Oct. 26, 2016, now abandoned, said application No. 17/379,675 is a continuation-in-part of application No. 15/335,320, filed on Oct. 26, 2016, now Pat. No. 9,905,602, said application No. 15/942,455 is a division of application No. 15/335,320, filed on Oct. 26, 2016, now Pat. No. 9,905,602, which is a continuation-in-part of application No. 14/701,326, filed on Apr. 30, 2015, now Pat. No. 9,944,041, which is a continuation-in-part of application No. 13/219,920, filed on Aug. 29, 2011, now Pat. No. 9,180,623.

(60) Provisional application No. 63/225,788, filed on Jul. 26, 2021, provisional application No. 63/194,486, filed on May 28, 2021.

(51) Int. Cl.
| | |
|---|---|
| *H10K 59/40* | (2023.01) |
| *G06F 3/041* | (2006.01) |
| *G06F 3/044* | (2006.01) |
| *H10K 50/17* | (2023.01) |
| *H10K 59/12* | (2023.01) |
| *H10K 71/00* | (2023.01) |
| *H10K 77/10* | (2023.01) |
| *F41H 5/04* | (2006.01) |
| *G09G 3/3225* | (2016.01) |
| *H10K 102/00* | (2023.01) |

(52) U.S. Cl.
CPC .......... *H10K 59/40* (2023.02); *G06F 3/0412* (2013.01); *G06F 3/044* (2013.01); *H10K 50/171* (2023.02); *H10K 59/12* (2023.02); *H10K 71/00* (2023.02); *H10K 77/111* (2023.02); *G06F 2203/04102* (2013.01); *G06F 2203/04103* (2013.01); *G06F 2203/04107* (2013.01); *G09G 3/3225* (2013.01); *G09G 2380/02* (2013.01); *H10K 59/1201* (2023.02); *H10K 2102/311* (2023.02)

(58) Field of Classification Search
None
See application file for complete search history.

(56) References Cited

U.S. PATENT DOCUMENTS

| | | | | |
|---|---|---|---|---|
| 2009/0255022 A1* | 10/2009 | Smith | ..................... | B29C 43/20 |
| | | | | 2/2.5 |
| 2015/0033935 A1* | 2/2015 | Boyer | ...................... | B32B 7/12 |
| | | | | 89/36.02 |
| 2018/0335282 A1* | 11/2018 | Ganor | .................... | F41H 5/013 |

* cited by examiner

*Primary Examiner* — Mohammad M Ameen

(74) *Attorney, Agent, or Firm* — Gugliotta & Gugliotta LPA

(57) ABSTRACT

A custom molded body armor element is provided that is conformed directly on the end user's torso or other body part. The element contains a room-temperature vulcanizing material that is conformable until activated, and will then cure to a customized shape. A room-temperature vulcanizing body armor pouch is applied to the torso of a supine end user, or inserted in the vest pocket if creating a hard body armor plates. The pouch contains essentially three elements: a two part epoxy; a polyethylene material infused with carbon nanotubes; and nanoparticles of silicon carbon, silicon boride or similar ceramic material. The two part epoxy is activated by mixing/combining within the pouch. Once activated the pouch may be conformed to a desired shape by applying to the torso or placing into a carrier pocket of a donned the vest. After a cure time the pouch will solidify to the desired customized shape.

14 Claims, 1 Drawing Sheet

MOLDED BODY ARMOR PANELS

RELATED APPLICATIONS

The present invention claims the benefit of U.S. Provisional Application 63/225,788 filed on Jul. 26, 2021. Additional applications of related continuity are further disclosed as part of the Application Data Sheet filed pursuant to 37 C.F.R. § 1.76. All Related Applications are incorporated by reference as if fully rewritten herein.

BACKGROUND OF THE INVENTION

1. Field of the Invention

This invention relates to improved composite ballistic material protective inserts for use with commercially available tactical vests or "plate carriers" and, more particularly, to an innovative molding process for the manufacture thereof in customized sizes and conformable to a user.

2. Description of the Related Art

Various materials for use in anti-ballistic shielding are known, as are method for their manufacture. For example, the following innovations to the present inventor describe a variety of materials, methods of making such materials, and devices using such materials.

U.S. Ser. No. 16/026,111, filed on Sep. 12, 2018, describes a method for making composite ballistic material protective inserts as replacements for small arms protective insert type plates for use with tactical vests or plate carriers. The method utilizes manufacturing simultaneously a plurality of small arms protective inserts type inserts simultaneously in a vertically aligned multi-cavity mold using non-fiber reinforced composite planar sheets of molecularly aligned plastic materials.

In its related application U.S. Ser. No. 15/335,252, filed on Oct. 26, 2016, an innovative multi-cavity mold is described for use in such a molding process. The mold is vertically aligned with multiple cavities. Each mold comprises a lower mold element, an upper element, and a plurality of intermediate elements vertically aligned about a plurality of guide rods. Each intermediate element comprises a mold retainer that secures a mold core coordinating with a cavity. Lower mold elements and upper mold elements further are formed of a mold retainer and an insert secured therein that includes a core or cavity element that works in conjunction with an adjacent intermediate element.

And, U.S. Pat. No. 9,944,041 teaches a composite ballistic shielding material formed utilizing ribbons of randomly-oriented film, laid up or woven in bias plies. The sheet plies are made narrow strips of PVC films are held side-by-side and rigidly framed as a square, into a thin layer, and then trimmed. The strips may be approximately 0.010" wide. The formed up layer is then immersed in a low-hardness thermosetting liquid glue and laid down as a first ply. Subsequent plies are made by repeating the same process, and adding the step of rotating the frame to a pre-determined angle before laying down the ply onto the previous ply. When a pre-determined number of layers or a desired thickness is achieved, the lay-up is transferred to a press for curing into panels.

Also, in U.S. Pat. No. 9,180,623 a composite ballistic shielding material is formed utilizing ribbons of randomly-oriented film, laid up or woven in bias plies. The sheet plies are made narrow strips of PVC films are held side-by-side and rigidly framed as a square, into a thin layer, and then trimmed. The strips may be approximately 0.010" wide. The formed up layer is then immersed in a low-hardness thermosetting liquid glue and laid down as a first ply. Subsequent plies are made by repeating the same process, and adding the step of rotating the frame to a pre-determined angle before laying down the ply onto the previous ply. When a pre-determined number of layers or a desired thickness is achieved, the lay-up is transferred to a press for curing into panels.

Penultimately, U.S. Ser. No. 17/379,875, filed on Jul. 19, 2021 describes a method of forming a composite anti-ballistic materials by molecularly orienting layers of laminated modified polyethylene material at a biased orientation between layers. Carbon nanotubes are layered polyethylene layers. Magneto rheological fluid may also be mixed within the layers of carbon nanotubes. The alternate cycling of heating and cooling provided to the laminated biased oriented material between the melting point of the material and its freezing point. Mechanical tension may further be imparted during alternate cycling of heating and cooling.

Finally, U.S. Ser. No. 63/194,486, filed on May 28, 2021 teaches a light weight ballistic plate capable of protection against armor piercing rounds. The ballistic plate is formed of a carbon steel. At least a part of the carbon content includes single-wall carbon nanotubes (SWCNTs) or multi-wall carbon nanotubes (MWCNTs). The carbon nanotube laden steel is thereafter forged in a manner that manipulate and align nanotubes within the steel. Such molecular alignment provides for the controlled dissipation of energy about the X-Y surface plane of the plate, thereby providing impact resistance and capture characteristics for incoming ballistic rounds.

All of the above add to the continuous improvement of lower weight and/or lower cost life saving personal protection. However, all uses of body armor ballistic protection encounter a common problem of obtaining a proper form or fit to the end users. Different torso sizes and shapes between individuals of the same sex, or of different sexes, results in the creations of several 'standard' sizes and shapes from which a user must select. There will inevitably be a certain number of ill fitting or non-fitting systems for a percentage of the population.

Consequently a need for customizing the fit of ballistic shielding to a users is needed.

SUMMARY OF THE INVENTION

It is thus an object of the present invention to provide a method of forming conformable armor elements capable of ballistic resistant protection.

It is a feature of the present invention to provide a conformable, sealed armor element that can be conformed to a custom shape and activated to solidify into a solid element having a selected level of ballistic threat protection.

The present invention provides a custom molded body armor element that is conformed directly on the end user's torso or other body part. The element contains a room-temperature vulcanizing material that is conformable until activated, and will then cure to a customized shape. A room-temperature vulcanizing body armor pouch is applied to the torso of a supine end user, or inserted in the vest pocket if creating a hard body armor plates. The pouch contains essentially three elements: a two part epoxy; a polyethylene material infused with carbon nanotubes; and nanoparticles of silicon carbon (SiC), silicon boride (SiB) or similar ceramic material. The two part epoxy may be activated by mixing/combining within the pouch by, for example, shaking the pouch to mix and activate. Once activated the pouch may be conformed to a desired shape such as, for example, by applying to the torso or placing into a carrier pocket of a donned the vest. After a cure time the pouch will solidify to the desired customized shape.

Advantages of the present products and processes allow for the customized fitting of armor protection. In addition to custom fitting to the body of an individual user, such customized fitting may also be for protection, such as for within panels of vehicle, structures or other uses.

Another advantage of the present invention is that variations in ballistic protection levels may be provided by modifying the relevant proportions and/or amounts of the pouch components.

Further, the present methods and resulting products result in armor products that eliminate many of the manufacturing steps of conventional or prior systems, resulting in a less expensive end product.

Further objects, features, elements and advantages of the invention will become apparent in the course of the following description.

BRIEF DESCRIPTION OF THE DRAWINGS

The advantages and features of the present invention will become better understood with reference to the following more detailed description and claims taken in conjunction with the accompanying drawings, in which like elements are identified with like symbols, and in which:

DESCRIPTION OF THE PREFERRED EMBODIMENTS

Figure 1:
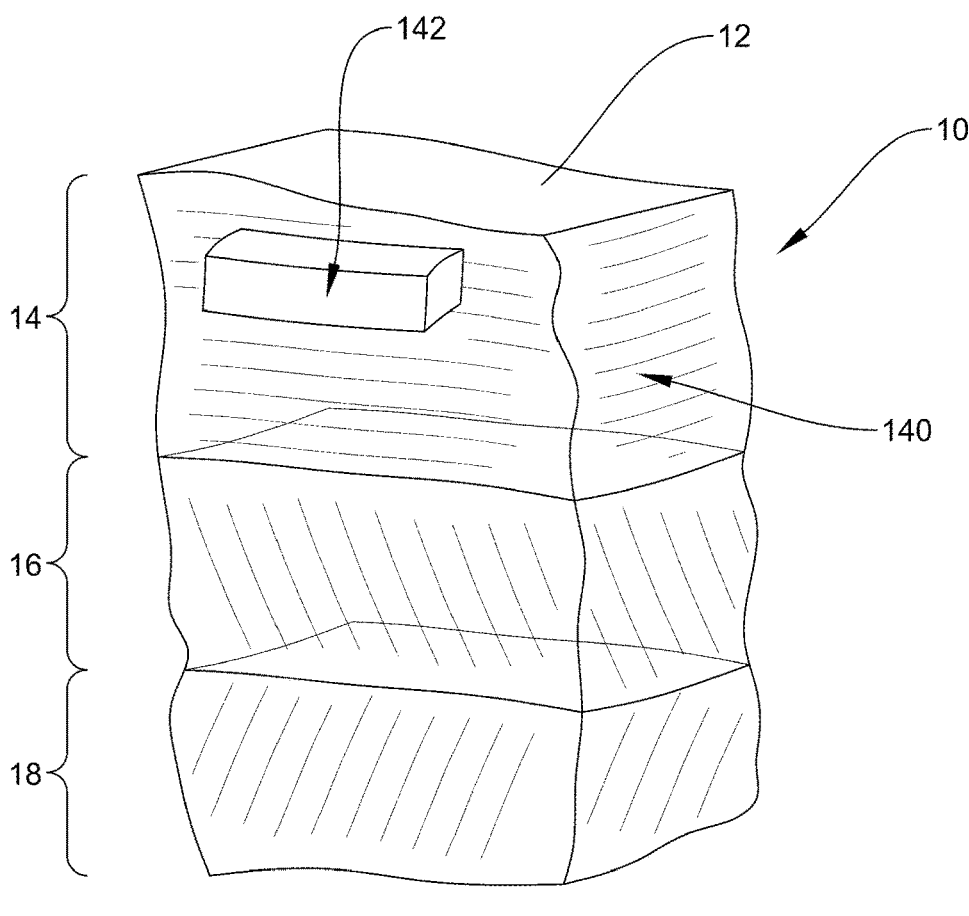
FIG. 1 is a schematic of a molded body armor panel according to a preferred embodiment of the present invention.

The best mode for carrying out the invention is presented in terms of its preferred embodiment, herein depicted within the Figures. It should be understood that the legal scope of the description is defined by the words of the claims set forth at the end of this patent and that the detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims.

Referring now to the drawings, a custom molded body armor element, generally noted as 10, is provided that is capable of being conformed directly on the end user's torso or other body part. The element 10 is formed of a flexible, sealed pouch 12 containing a room-temperature vulcanizing material that is conformable until activated, and then curable to a customized shape. The pouch 12 contains essentially three elements: a two part epoxy 14; a polyethylene material infused with carbon nanotubes 16; and nanoparticles of silicon carbon (SiC), silicon boride (SiB) or similar ceramic material 18.

The two part epoxy 14 may include a resin component 140 and hardener component 142. It is preferred that the resin 140 be of a flowable consistency, yet having a high enough viscosity to facilitate conforming the filled pouch to a desired shape.

Nanocomposites of high-density polyethylene (HDPE) 16 allow for the HDPE to be modified to optimal mechanical properties and thermal stability. Utilizing carbon nanotubes or other nano-materials, the HDPE and the nanoparticles will be blended together to produce an environment-friendly nano-material with improved physical and chemical properties. The carbon nanotubes modifies the crystallinity of HDPE to improved the final mechanical properties.

The use of a powdered ceramic material 18 bonds with the remaining components and imparts an increased level of penetration resistance. The use of silicon borides (also known as boron silicides) provide lightweight ceramic compounds. Alternately, the use of silicon carbide (SiC), also known as carborundum provides grains that can be bonded together to form a very hard ceramic.

Figure 2:
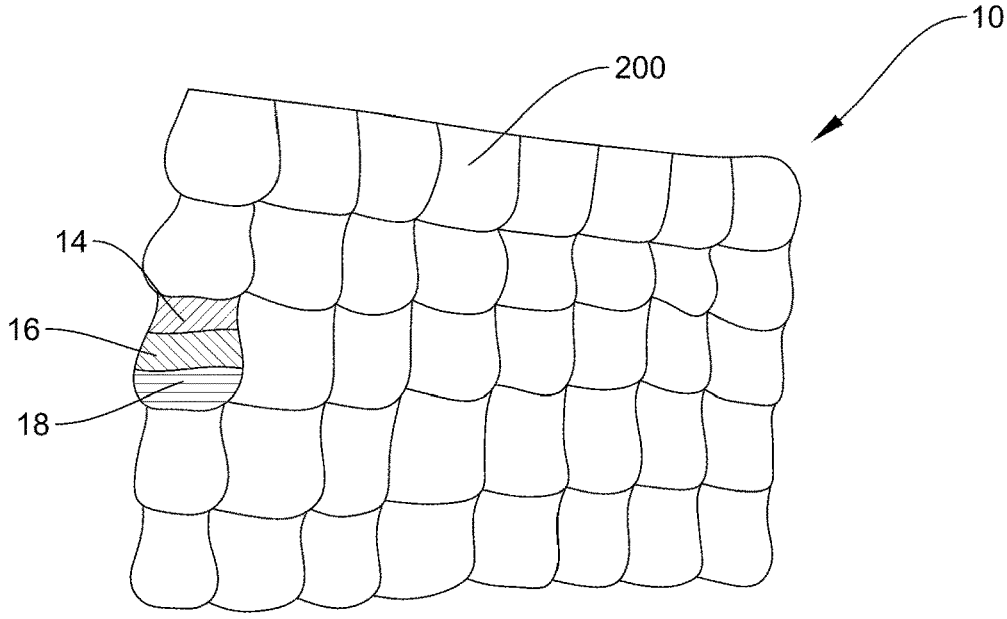
FIG. 2 is a schematic of a multi-cell alternate embodiment thereof.

The filled pouch 10 may be activated by mixing together the contents. In an alternate embodiment, as shown in conjunction with FIG. 2, the contents may be divided between a plurality of cells 200 formed with in the pouch 10. Such subdividing allows for more control over the flowable, moldable contents during curing. Once activated the pouch 10 may be conformed to a desired shape such as, for example, by applying to the torso or placing into a carrier pocket of a donned the vest. After a cure time the pouch will solidify to the desired customized shape.

The foregoing descriptions of specific embodiments of the present invention are presented for purposes of illustration and description. The Title, Background, Summary, Brief Description of the Drawings and Abstract of the disclosure are hereby incorporated into the disclosure and are provided as illustrative examples of the disclosure, not as restrictive descriptions. It is submitted with the understanding that they will not be used to limit the scope or meaning of the claims. In addition, in the Detailed Description, it can be seen that the description provides illustrative examples and the various features are grouped together in various embodiments for the purpose of streamlining the disclosure. This method of disclosure is not to be interpreted as reflecting an intention that the claimed subject matter requires more features than are expressly recited in each claim. Rather, as the following claims reflect, inventive subject matter lies in less than all features of a single disclosed configuration or operation. The following claims are hereby incorporated into the Detailed Description, with each claim standing on its own as a separately claimed subject matter.

The claims are not intended to be limited to the aspects described herein, but is to be accorded the full scope consistent with the language claims and to encompass all legal equivalents. Notwithstanding, none of the claims are intended to embrace subject matter that fails to satisfy the requirement of 35 U.S.C. § 101, 102, or 103, nor should they be interpreted in such a way. Any unintended embracement of such subject matter is hereby disclaimed. They are not intended to be exhaustive nor to limit the invention to precise forms disclosed and, obviously, many modifications and variations are possible in light of the above teaching. The embodiments are chosen and described in order to best explain principles of the invention and its practical application, to thereby enable others skilled in the art to best utilize the invention and its various embodiments with various modifications as are suited to the particular use contemplated. It is intended that a scope of the invention be defined broadly by the Drawings and Specification appended hereto and to their equivalents. Therefore, the scope of the invention is in no way to be limited only by any adverse inference under the rulings of *Warner-Jenkinson Company*, v. *Hilton Davis Chemical*, 520 US 17 (1997) or *Festo Corp.* v.

*Shoketsu Kinzoku Kogyo Kabushiki Co.*, 535 U.S. 722 (2002), or other similar caselaw or subsequent precedent should not be made if any future claims are added or amended subsequent to this Application.

We claim:

1. A contoured, form-fitting flexible armor panel comprising:
   a sealed flexible container; and
   a room-temperature vulcanizing material that is conformable until activated and contained within said sealed flexible container, said material adapted to cure to a customized shape at an ambient temperature without application of external heat.

2. The contoured, form-fitting flexible armor panel of claim 1, wherein said material consists essentially of:
   a two part epoxy;
   a polyethylene material infused with carbon nanotubes; and
   nanoparticles of ceramic material.

3. The contoured, form-fitting flexible armor panel of claim 1, wherein said material comprises:
   a two part epoxy;
   a polyethylene material infused with carbon nanotubes; and
   nanoparticles of silicon carbon (SiC) or silicon boride (SiB).

4. The contoured, form-fitting flexible armor panel of claim 2, wherein said two part epoxy comprises a hardener and a resin that is activated by mixing/combining within the pouch.

5. The contoured, form-fitting flexible armor panel of claim 3, wherein said two part epoxy comprises a hardener and a resin that is activated by mixing/combining within the pouch.

6. A method of using the armor panel of claim 1, comprising:
   obtaining a tactical vest or plate carrier;
   donning the tactical vest or plate carrier; and
   inserting the armor panel in an uncured state in a pocket of the tactical vest or plate carrier adapted for receiving a hard body armor plates;
   activating the armor panel;
   conforming the armor panel to a desired shape by applying to the torso directly on a user's body or placing into a carrier pocket of a donned the vest; and
   waiting for a cure time to solidify to the armor panel to a desired customized shape.

7. A method of using the armor panel of claim 2, comprising:
   obtaining a tactical vest or plate carrier;
   donning the tactical vest or plate carrier; and
   inserting the armor panel in a pocket of the tactical vest or plate carrier adapted for receiving a hard body armor plates;
   activating the armor panel;
   conforming the armor panel to a desired shape by applying to the torso or placing into a carrier pocket of a donned the vest; and
   waiting for a cure time to solidify to the armor panel to a desired customized shape.

8. A method of using the armor panel of claim 3, comprising:
   obtaining a tactical vest or plate carrier;

donning the tactical vest or plate carrier; and
   inserting the armor panel in a pocket of the tactical vest or plate carrier adapted for receiving a hard body armor plates;
   activating the armor panel;
   conforming the armor panel to a desired shape by applying to the torso or placing into a carrier pocket of a donned the vest; and
   waiting for a cure time to solidify to the armor panel to a desired customized shape.

9. A method of using the armor panel of claim 4, comprising:
   obtaining a tactical vest or plate carrier;
   donning the tactical vest or plate carrier; and
   inserting the armor panel in a pocket of the tactical vest or plate carrier adapted for receiving a hard body armor plates;
   activating the armor panel;
   conforming the armor panel to a desired shape by applying to the torso or placing into a carrier pocket of a donned the vest; and
   waiting for a cure time to solidify to the armor panel to a desired customized shape.

10. A method of using the armor panel of claim 5, comprising:
   obtaining a tactical vest or plate carrier;
   donning the tactical vest or plate carrier; and
   inserting the armor panel in a pocket of the tactical vest or plate carrier adapted for receiving a hard body armor plates;
   activating the armor panel;
   conforming the armor panel to a desired shape by applying to the torso or placing into a carrier pocket of a donned the vest; and
   waiting for a cure time to solidify to the armor panel to a desired customized shape.

11. A custom contoured, form-fitting armor panel for use with a tactical vest or plate carrier comprising:
   a sealed flexible container;
   a room-temperature vulcanizing material that is conformable until activated and contained within said sealed flexible container, said material adapted to cure at an ambient temperature without application of external heat to a customized shape and consisting essentially of:
   a two part epoxy;
   a polyethylene material infused with carbon nanotubes; and
   nanoparticles of ceramic material.

12. The custom contoured, form-fitting armor panel for use with a tactical vest or plate carrier of claim 11, wherein ceramic material comprises silicon carbon (SiC) or silicon boride (SiB).

13. The custom contoured, form-fitting armor panel for use with a tactical vest or plate carrier of claim 11, wherein said two part epoxy comprises a hardener and a resin that is activated by mixing/combining within the pouch.

14. The custom contoured, form-fitting armor panel for use with a tactical vest or plate carrier of claim 12, wherein said two part epoxy comprises a hardener and a resin that is activated by mixing/combining within the pouch.

* * * * *